(12) United States Patent
Cheng et al.

(10) Patent No.: US 9,590,181 B2
(45) Date of Patent: Mar. 7, 2017

(54) TRIPTYCENE DERIVATIVES HAVING SYMMETRIC OR ASYMMETRIC SUBSTITUENTS AND ORGANIC LIGHT EMITTING DIODE USING THE SAME

(71) Applicant: National Tsing Hua University, Hsinchu (TW)

(72) Inventors: Chien-Hong Cheng, Hsinchu (TW); Ho-Hsiu Chou, Hsinchu (TW); Cheng-Chang Lai, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 242 days.

(21) Appl. No.: 14/281,191

(22) Filed: May 19, 2014

(65) Prior Publication Data

US 2015/0137084 A1 May 21, 2015

(30) Foreign Application Priority Data

Nov. 15, 2013 (TW) .............................. 102141604 A

(51) Int. Cl.
*H01L 51/00* (2006.01)
*H01L 51/50* (2006.01)

(52) U.S. Cl.
CPC ........ *H01L 51/0055* (2013.01); *H01L 51/006* (2013.01); *H01L 51/0067* (2013.01); *H01L 51/0072* (2013.01); *H01L 51/5016* (2013.01)

(58) Field of Classification Search
None
See application file for complete search history.

(56) References Cited

U.S. PATENT DOCUMENTS

| 6,509,110 B1* | 1/2003 | Salbeck | C07C 13/64 252/301.35 |
| 2009/0105488 A1* | 4/2009 | Cheng | C07C 43/21 548/440 |
| 2011/0272680 A1 | 11/2011 | Suda et al. | |

FOREIGN PATENT DOCUMENTS

TW    I390007    3/2013

\* cited by examiner

*Primary Examiner* — J. L. Yang

(74) *Attorney, Agent, or Firm* — Muncy, Geissler, Olds & Lowe, P.C.

(57) ABSTRACT

Triptycene derivatives having symmetric or asymmetric substituents are provided. The triptycene derivatives of the present invention may be applied in phosphorescent lighting devices ranging from deep blue to red and may be applied as a host material, an electron transporting material or a hole transporting material. An OLED device is also herein disclosed.

10 Claims, 1 Drawing Sheet

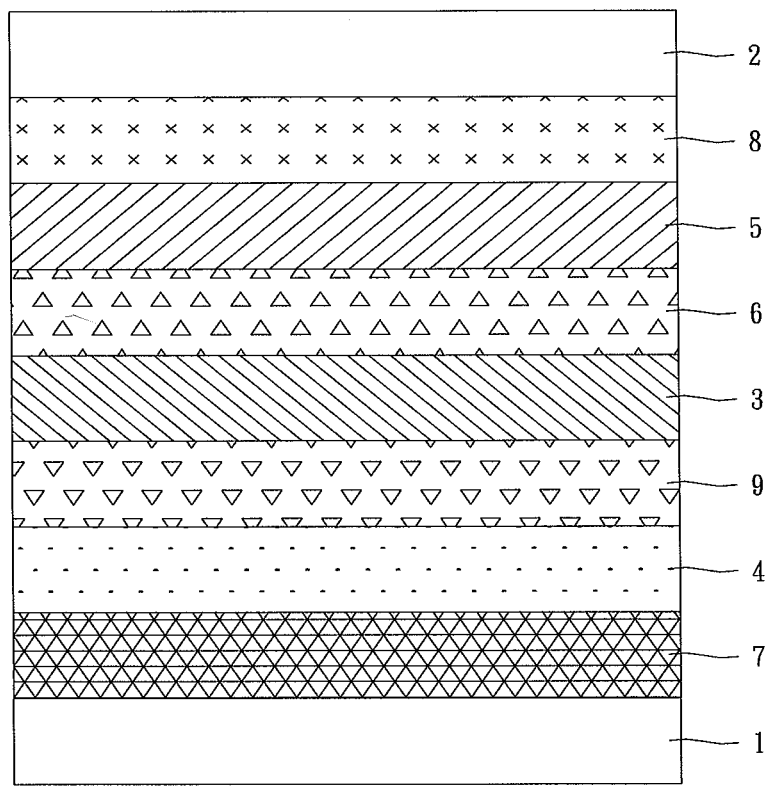

TRIPTYCENE DERIVATIVES HAVING SYMMETRIC OR ASYMMETRIC SUBSTITUENTS AND ORGANIC LIGHT EMITTING DIODE USING THE SAME

BACKGROUND OF THE INVENTION

1. Field of the Invention

The present invention relates to a triptycene derivative and an organic light emitting diode (OLED), and more particularly to a triptycene derivative having symmetric or asymmetric substituents and organic light emitting diode using the same.

2. Description of the Prior Art

OLED (organic light-emitting diode), also commonly known as organic electroluminescent device, is a kind of LED having a organic layer as the active layer. OLED has been spotlighted due to a lot of advantages, such as self illumination, wider visual angle (>170°), shorter response time (~μs), higher contrast, higher efficiency, lower power consumption, higher brightness, lower operative voltage (3-10V), thinner size (<2 mm), flexibility and so on. In recent years, OLED has been gradually used in flat panel display. In comparison to LCD monitor, OLED displays are provided with OLED pixel array having self-luminous characteristics and therefore do not require additional back light module. To apply OLED into a full-color display, it is necessary and important to develop red, green, and blue light emitting materials with appropriate chromaticity and high light-emitting efficiency.

Excitons generated from recombining holes and electrons have triplet state or singlet state for its spin state. Singlet exciton relaxation radiates fluorescence and triplet exciton relaxation radiates phosphorescence. Phosphorescence achieves 3-fold efficiency comparing to fluorescence and may greatly enhance the IQE (internal quantum efficiency) of devices up to 100% by adopting metal complexes in electroluminescent configuration to achieve strong spin-orbital coupling and mixing of singlets and triplets. Therefore, phosphorescent metal complexes are now adopted as phosphorescent dopants in the emitting layer of OLED.

In addition, by using a doping method in the emitting layer, self-quenching of the emitting materials can be reduced greatly to enhance the efficiency of the device. Therefore, the search for proper host materials becomes noteworthy since host materials must be capable of capturing carriers and have good energy transfer properties, high glass transition temperature, high thermal stability and appropriate energy gap of the singlet and triplet excited states. However, it would be difficult to search for host materials that fully meet the criteria and there is still some room for host material development in OLED.

Regarding triptycene derivatives, Taiwan patent No. 1390007 disclosed triptycene derivatives having tri-substituents as listed below.

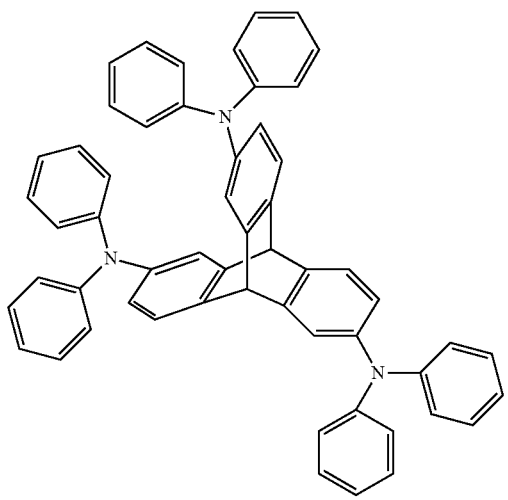 [SMILES: c1ccc(N(c2ccccc2)c2ccc3c(c2)C2c4ccc(N(c5ccccc5)c5ccccc5)cc4C3c3cc(N(c4ccccc4)c4ccccc4)ccc32)cc1]

US patent application No. 20110272680 disclosed triptycene derivatives as listed below.

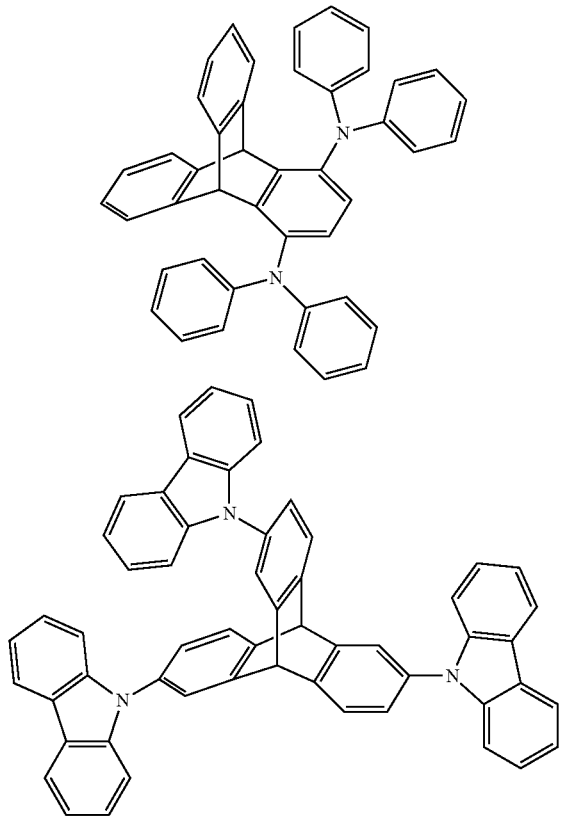

To sum up, to develop novel host materials is now a current goal.

SUMMARY OF THE INVENTION

The present invention is directed to providing novel triptycene derivatives.

According to one embodiment of the present invention, a triptycene derivative includes a chemical formula represented by Formula (I):

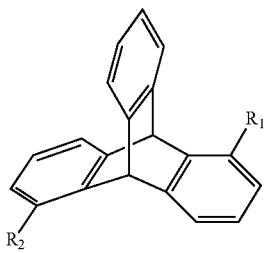

The present invention is also directed to providing an OLED device with high efficiency and performance.

According to another embodiment, an organic light emitting diode includes a cathode, an anode and an organic layer configured between the cathode and the anode and comprising the aforementioned triptycene derivative.

The triptycene derivative of the present invention may be configured as a host emitting material, an electron transport material, or a hole transport material and may be applied in blue phosphorescent light emitting diode, a green phosphorescent light emitting diode, or a red phosphorescent light emitting diode.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

FIG. 1 is a schematic diagram illustrating an organic light emitting device containing triptycene derivatives according to one embodiment of the present invention.

DESCRIPTION OF THE PREFERRED EMBODIMENT

The triptycene derivatives of the present invention have a chemical formula represented by Formula (I):

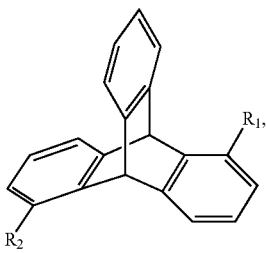

wherein each of $R_1$ and $R_2$ is independently selected from the group consisting of halogen, aryl group, aryl substituted aryl group, $C_1$-$C_{20}$ alkyl substituted aryl group, $C_1$-$C_{20}$ haloalkyl substituted aryl group, amino substituted aryl group, halogen substituted aryl group, heteroaryl substituted aryl group, heteroaryl group, aryl substituted heteroaryl group, $C_1$-$C_{20}$ alkyl substituted heteroaryl group, $C_1$-$C_{20}$ haloalkyl substituted heteroaryl group, halogen substituted heteroaryl group, heteroaryl substituted heteroaryl group, aryl substituted amino group, heteroaryl substituted amino group, phosphine oxide group, aryl substituted phosphine oxide group, $C_1$-$C_{20}$ alkyl substituted phosphine oxide group, $C_1$-$C_{20}$ haloalkyl substituted phosphine oxide group, halogen substituted phosphine oxide group, heteroaryl substituted phosphine oxide group, silane group, aryl substituted silane group, $C_1$-$C_{20}$ alkyl substituted silane group, $C_1$-$C_{20}$ haloalkyl substituted silane group, halogen substituted silane group, heteroaryl substituted silane group, wherein $R_1$ and $R_2$ are not simultaneously halogen, aryl substituted amino group and heteroaryl substituted amino group.

The incorporation of some substituents to triptycenes has been introduced in Taiwan patent No. 1390007, hence incorporated herein by reference.

The term "aryl" refers to a $C_6$ to $C_{30}$ hydrocarbon moiety having one or more aromatic rings. Examples of aryl moieties include phenyl (Ph), phenylene, naphthyl, naphthylene, pyrenyl, anthryl, and phenanthryl.

The term "heteroaryl" refers to a $C_5$ to $C_{10}$ moiety having one or more aromatic rings that contain at least one heteroatom (e.g., N, O, or S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl and indolyl.

Alkyl, alkenyl, alkynyl, cycloalkyl, cycloalkenyl, heterocycloalkyl, heterocycloalkenyl, aryl, and heteroaryl mentioned herein include both substituted and unsubstituted moieties, unless specified otherwise. Possible substituents on cycloalkyl, cycloalkenyl, heterocycloalkyl, heterocycloalkenyl, aryl, and heteroaryl include, but are not limited to, $C_1$-$C_{10}$ alkyl, $C_2$-$C_{10}$ alkenyl, $C_2$-$C_{10}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, $C_1$-$C_{10}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, $C_1$-$C_{10}$ alkylsulfonamino, arylsulfonamino, $C_1$-$C_{10}$ alkylimino, arylimino, $C_1$-$C_{10}$ alkylsulfonimino, arylsulfonimino, hydroxyl, halo, thio, $C_1$-$C_{10}$ alkylthio, arylthio, $C_1$-$C_{10}$ alkylsulfonyl, arylsulfonyl, acylamino, aminoacyl, aminothioacyl, amido, amidino, guanidine, ureido, thioureido, cyano, nitro, nitroso, azido, acyl, thioacyl, acyloxy, carboxyl, and carboxylic ester. On the other hand, possible substituents on alkyl, alkenyl, or alkynyl include all of the above-recited substituents except $C_1$-$C_{10}$ alkyl. Cycloalkyl, cycloalkenyl, heterocycloalkyl, heterocycloalkenyl, aryl, and heteroaryl can also be fused with each other.

It is noted that the present invention may include symmetrical or asymmetrical di-substituted triptycene derivatives, i.e. R1 and R2 may be the same or different. In a preferred embodiment, R1 and R2 are selected from the following substituents.

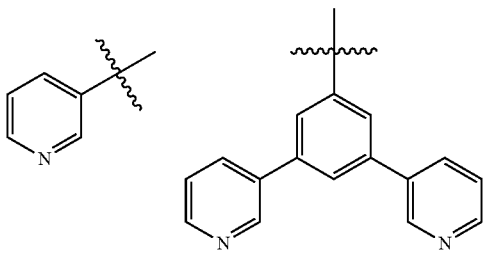

-continued

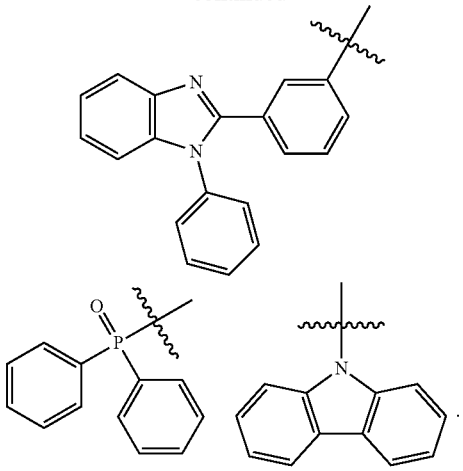

Synthesis Method for Compounds

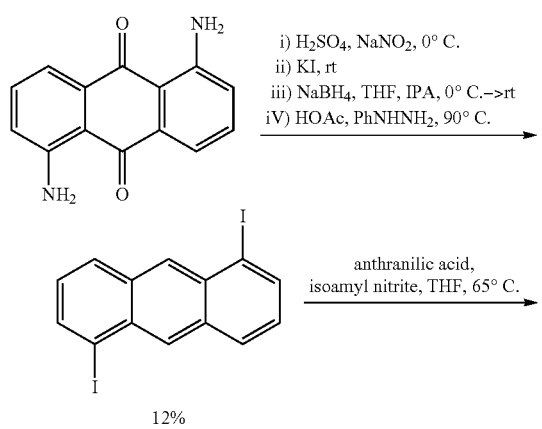

Refer to the above scheme, which shows the synthesis process of 1,5-diiodotriptycene. The 1,5-diaminoanthraquinone (10 g, 42 mmol) was added into $H_2SO_4$ (40 ml, 0° C.), $NaNO_2$ (8 g, 116 mmol) was slowly added the time over 30 minutes to form brown solution which was then stirred for three hours and poured into water (500 ml). After stirred for 30 minutes at room temperature, the dark purple solid was collected by filtration with suction and dissolved in water (500 ml). The solution was then added with KI (10 g, 62 mmol) to stir for three hours and filtrated with suction to collect brown solid. The filtered solution was added with KI (10 g, 62 mmol), and stirred for three hours. A large portion of a brown solid was collected by filtration with suction and combined with the previously obtained product. The collected solid was respectively washed with saturated $Na_2S_2O_{3(aq)}$ solution and pure water, then dried. The resulting solid was dispersed in mixture solution of isopropanol (200 ml) and tetrahydrofuran (200 ml) and was then cooled to 0° C. The solution was added with sodium borohydride (4 g, 105 mmol) and kept stirring until the solution became homogeneous. The solution was added to water to collect the solid by filtration with suction. The solid then underwent repeated washing with water, and then dried. The dried solids, glacial acetic acid (100 ml) and phenylhydrazine (12 ml, 122 mmol) were placed in a single-neck flask and heat to 90° C. for reaction for seven hours. The solution were diluted with water and then filtered to collect solid with suction. The solid was washed with water to remove the remaining acetic acid, dried and then use Soxhlet extraction to collect product with hexane. Finally, to remove hexane and give bright yellow solid as product.

1,5-diiodotriptycene

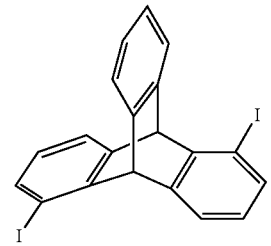 [SMILES: Ic1cccc2c1C1c3ccccc3C2c2c(I)cccc21]

$^1$H NMR (400 MHz, CDCl$_3$, δ):

7.44 (dd, J=5.2 Hz, 2H), 7.43 (d, J=8.4 Hz, 2H), 7.37 (d, J=7.2 Hz, 2H), 7.03 (dd, J=5.2 Hz, 2H), 6.71 (t, J=7.6 Hz, 2H), 5.72 (s, 2H).

$^{13}$C NMR (100 MHz, CDCl$_3$, δ):

148.2, 146.1, 144.1, 135.2, 127.2, 125.7, 124.1, 58.6

Refer to the below scheme illustrating the synthetic process of triptycene derivatives having identical di-substituents of the present invention.

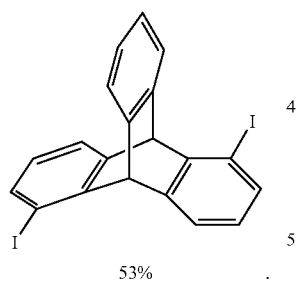

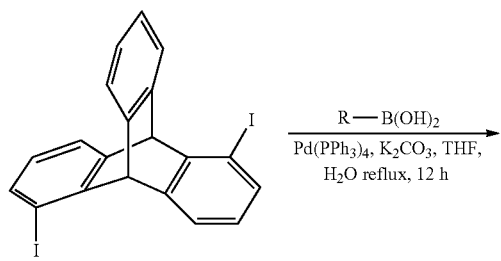

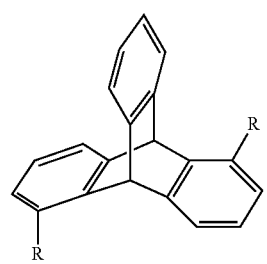

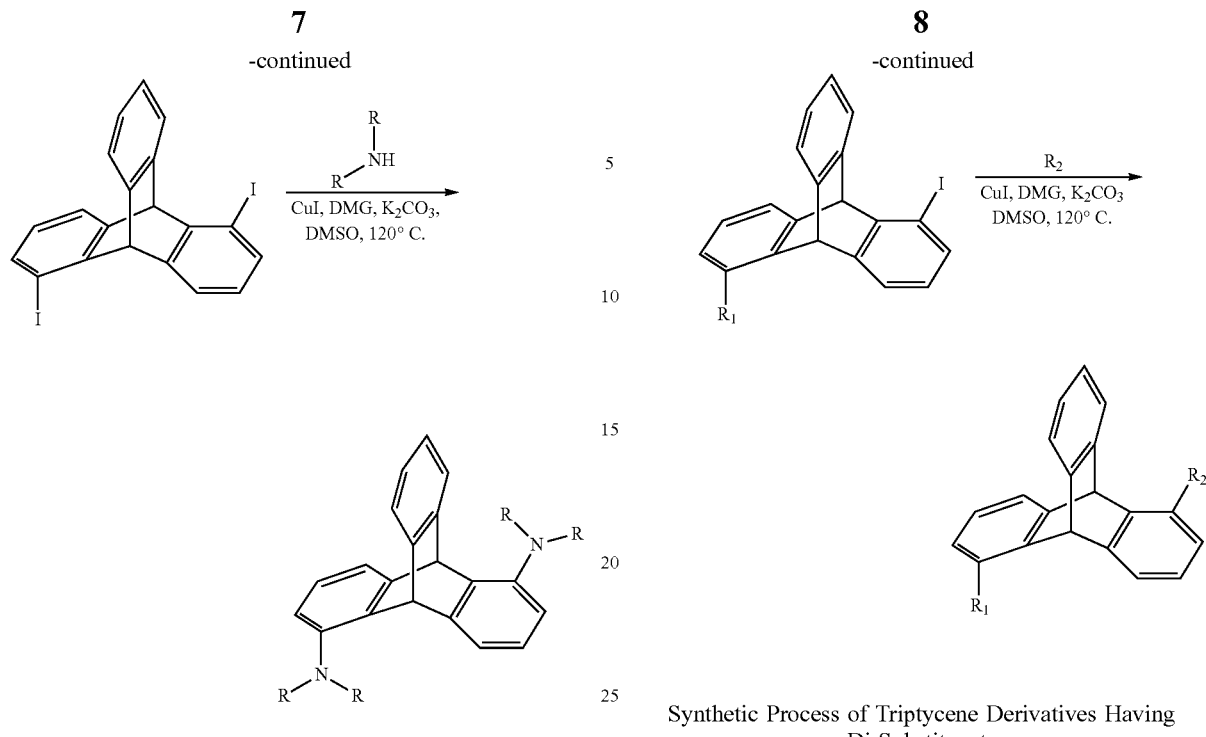

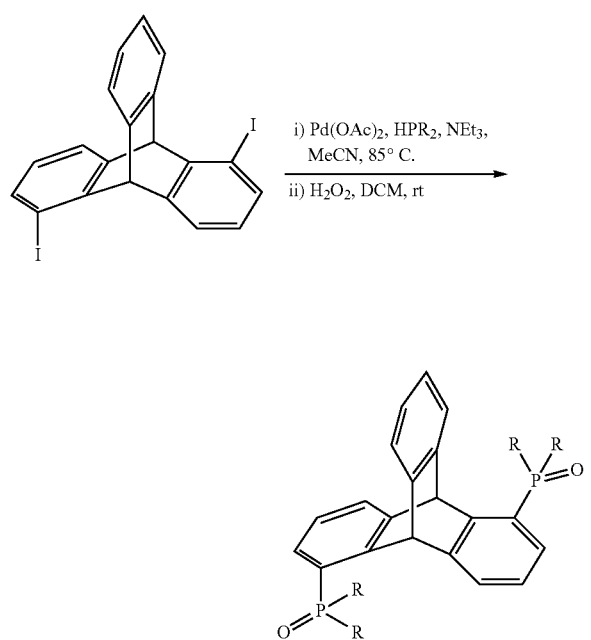

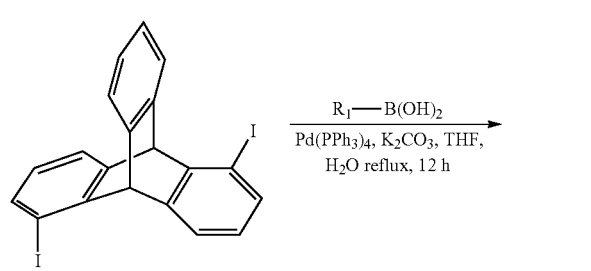

Synthetic Process of Triptycene Derivatives Having Di-Substituents

Scheme I 1,5-Diiodotriptycene (505 mg, 1.0 mmol), boronic acid (3.0, mmol) and Pd(PPh$_3$)$_4$ (46 mg, 2 mol %) were dissolved in anhydrous THF (60 ml), and added with 2M K$_2$CO$_{3(aq)}$ (30 ml) with nitrogen purge. The mixture was heated and refluxed for 12 hours and then extracted with DCM (dichloromethane, 50 ml×3) and purified with column chromatography.

Scheme II 1,5-diiodotriptycene (0.5 mmol), di-substituted amines (1.2 mmol) CuI (10 mol %), N,N-dimethyl glycine (20 mol %) and K$_2$CO$_3$(10.0 mmol) were mixed and added to dimethyl sulfoxide (5 ml) under nitrogen purging. The mixture was heated to 120° C. and maintained for 72 hours. The mixture was poured into water and then extracted with DCM (dichloromethane, 25 ml×3) and purified with column chromatography.

Scheme III 1,5-diiodotriptycene (0.5 mmol), di-substituted phosphide (1.2 mmol), palladium acetate (3 mol %) acetonitrile (2 ml) and triethylamine (2 ml) were mixed, heated to 85° C. and maintained for 72 hours. The mixture passed through celite and silica gel to remove metal compound and was then washed with DCM (5 ml×3) to remove solvent and purified with column chromatography. The purified product was dissolved with DCM (10 ml) and added H$_2$O$_{2(aq)}$ (30 wt %) for the mixture was stirred for 24 hours at room temperature. The mixture was extracted with DCM (15 ml×3) and dried over MgSO$_4$. To remove solvent by rotavap, and then give white like solid as product.

DBITP (1,5-bis[3-(1'-phenyl-1H-benzo[d]imidazole)phenyl]triptycene)

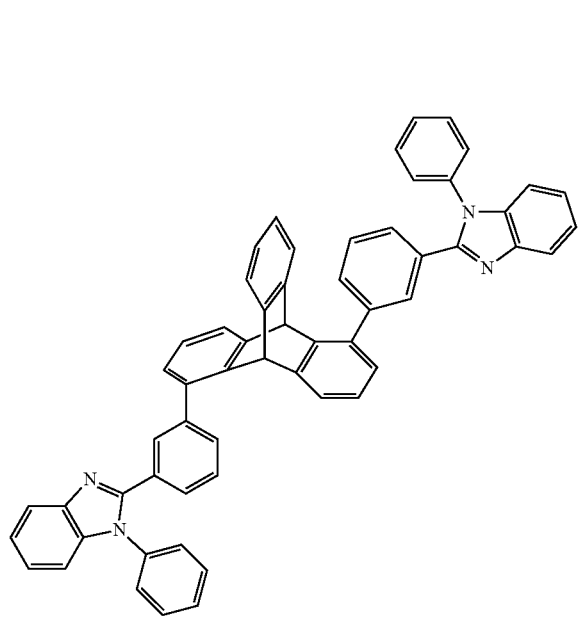

DBITP
$E_S/E_T$ (eV) = 3.80/2.51
HOMO/LUMO = 5.91/2.11

$^1$H NMR (400 MHz, CDCl$_3$, δ):

7.92 (d, J=8.4 Hz, 2H), 7.10 (d, J=8.0 Hz, 2H), 7.54 (s, 2H), 7.51-7.46 (m, 8H), 7.41-7.31 (m, 4H), 7.29-7.25 (m, 10H), 6.98-6.96 (m, 2H), 6.91 (t, J=7.6 Hz, 2H), 6.58 (d, J=7.6 Hz, 2H), 5.67 (s, 2H).

$^{13}$C NMR (100 MHz, CDCl$_3$, δ):

152.3, 145.4, 145.2, 143.1, 142.8, 140.4, 137.2, 137.0, 136.8, 130.6, 130.4, 129.9, 129.8, 128.6, 128.3, 128.2, 127.5, 126.2, 125.2, 124.9, 124.7, 123.8, 123.4, 123.2, 123.0, 119.9, 110.5, 50.9

TABLE 1

| DBiTP light-emitting spectrum data | | | |
|---|---|---|---|
| DBiTP | Conc. (M) | | Wavelength (nm) |
| UV | DCM 1 × 10$^{-5}$ | | 295 |
|  | Thin film | | 340, 295 |
| FL | DCM | 1 × 10$^{-5}$ | 354 |
|  |  | 1 × 10$^{-4}$ | 356 |
|  |  | 1 × 10$^{-3}$ | 355, 438 |
|  | Thin film | | 438 |
| 77K | Solution | 1 × 10$^{-5}$ | 494 |
|  | Thin film | | 501 |

DPyTP (1,5-bis(3-pyridin-3-yl)triptycene)

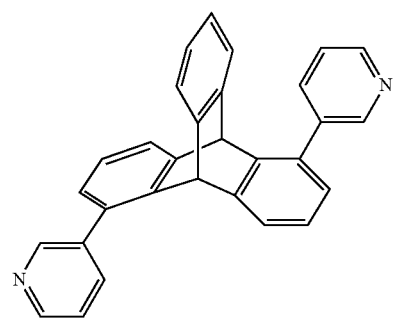

DPyTP
$E_S/E_T$ (eV) = 4.16/3.07
HOMO/LUMO = 6.21/2.15

$^1$H NMR (400 MHz, CDCl$_3$, δ):

8.72 (d, J=1.6 Hz, 4H), 7.75 (dd, J=6.4 Hz, 1.6 Hz, 2H), 7.50-7.47 (m, 2H), 7.35-7.33 (m, 4H), 7.06 (t, J=7.6 Hz, 2H), 7.00-76.96 (m, 4H), 5.65 (s, 2H).

$^{13}$C NMR (100 MHz, CDCl$_3$, δ):

150.0, 148.5, 145.5, 144.8, 143.1, 136.6, 136.0, 134.0, 126.5, 125.5, 125.4, 123.8, 123.7, 123.5, 50.8

TABLE 2

| DpyTP light-emitting spectrum data | | | |
|---|---|---|---|
| DPyTP | Conc. (M) | | Wavelength (nm) |
| UV | DCM 1 × 10$^{-5}$ | | 270 |
|  | Thin film | | 273 |
| FL | DCM | 1 × 10$^{-5}$ | 325 |
|  |  | 1 × 10$^{-4}$ | 327 |
|  |  | 1 × 10$^{-3}$ | 332 |
|  | Thin film | | 390 |
| 77K | Solution | 1 × 10$^{-5}$ | 494 |
|  | Thin film | | 501 |

DCTP (1,5-bis(dicarbazoyl)triptycene)

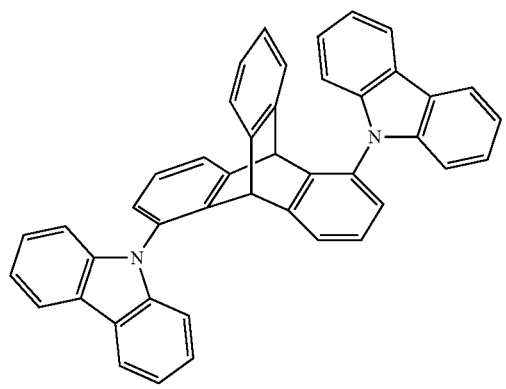

DCTP
$E_S/E_T$ (eV) = 3.60/3.01
HOMO/LUMO = 5.64/2.04

¹H NMR (400 MHz, CDCl₃, δ):
8.16-8.23 (m, 4H), 7.44 (t, J=7.6 Hz, 2H), 7.38 (d, J=7.6 Hz, 2H), 7.35-7.33 (m, 4H), 7.14-7.10 (m, 8H), 7.04-7.02 (dd, J=5.2 Hz, 2H), 6.95 (dd, J=5.2 Hz, 2H), 6.91-6.89 (dd, J=5.2 Hz, 2H), 5.16 (s, 2H).

¹³C NMR (100 MHz, CDCl₃, δ):
146.9, 144.3, 143.7, 141.7, 141.7, 132.3, 126.5, 126.0, 125.5, 124.5, 123.3, 123.2, 120.4, 120.3, 119.9, 110.5, 110.5, 49.5, 49.5

TABLE 3

| DCTP light-emitting spectrum data ||||
|---|---|---|---|
| DCTP | | Conc. (M) | Wavelength (nm) |
| UV | DCM | $1 \times 10^{-5}$ | 286, 292, 326, 339 |
|  | Thin film |  | — |
| FL | DCM | $1 \times 10^{-5}$ | 346 |
|  |  | $1 \times 10^{-4}$ | — |
|  |  | $1 \times 10^{-3}$ | — |
|  | Thin film |  | — |
| 77K | Solution | $1 \times 10^{-5}$ | 412 |
|  | Thin film |  | — |

DMATP (1,5-bis(p,p'-toylamino)triptycene)

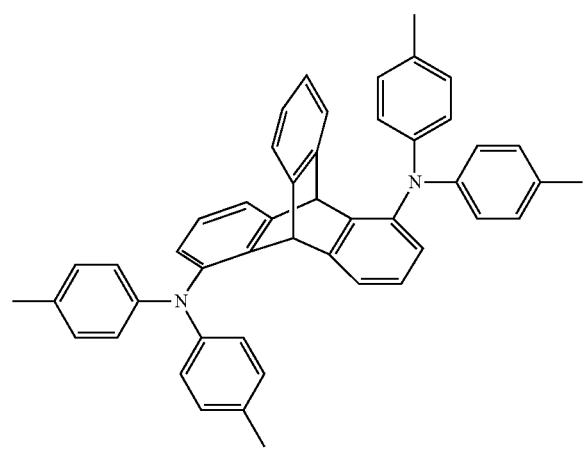

DMATP
$E_S/E_T$ (eV) = 3.60/3.00
HOMO/LUMO = 5.23/1.63

¹H NMR (400 MHz, CDCl₃, δ):
6.99 (d, J=8.4 Hz, 8H), 6.82-6.79 (m, 12H), 6.71-6.67 (m, 6H), 5.39 (s, 2H), 2.30 (s, 12H).

¹³C NMR (100 MHz, CDCl₃, δ):
147.0, 145.9, 144.5, 142.6, 141.9, 130.8, 130.6, 129.8, 125.9, 125.1, 124.6, 123.8, 122.1, 121.1, 121.4, 121.2, 49.7, 20.7

TABLE 4

| DMATP light-emitting spectrum data ||||
|---|---|---|---|
| DMATP | | Conc. (M) | Wavelength (nm) |
| UV | DCM | $1 \times 10^{-5}$ | 302 |
|  | Thin film |  | — |
| FL | DCM | $1 \times 10^{-5}$ | 370 |
|  |  | $1 \times 10^{-4}$ | — |
|  |  | $1 \times 10^{-3}$ | — |
|  | Thin film |  | — |
| 77K | Solution | $1 \times 10^{-5}$ | 414 |
|  | Thin film |  | — |

DPOTP (1,5-bis(diphenylphosphoryl)triptycene)

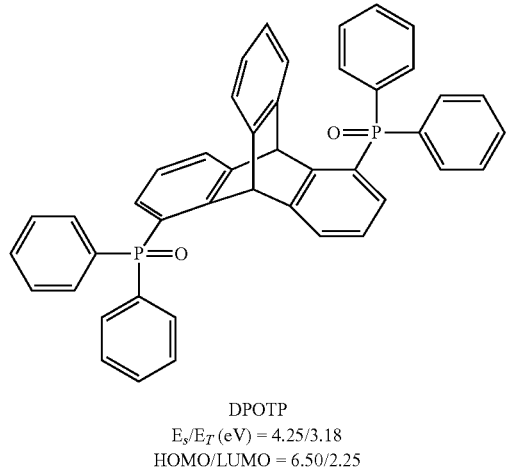 [SMILES: O=P(c1ccccc1)(c1ccccc1)c1cccc2c1C1c3ccccc3C2c2c1cccc2P(=O)(c1ccccc1)c1ccccc1]

DPOTP
$E_S/E_T$ (eV) = 4.25/3.18
HOMO/LUMO = 6.50/2.25

¹H NMR (400 MHz, CDCl₃, δ):
7.62 (t, J=8.4 Hz, 8H), 7.54 (t, J=7.6 Hz, 4H), 7.43 (m, 8H), 7.10 (d, J=7.2 Hz, 2H), 6.83-6.81 (m, 2H), 6.79-6.77 (m, 2H), 6.68-6.62 (m, 4H), 6.20 (s, 2H).

¹³C NMR (100 MHz, CDCl₃, δ):
150.0, 146.1, 146.0, 143.5, 133.4, 133.0, 132.4, 132.2, 132.1, 132.0, 131.8, 128.8, 128.7, 128.6, 128.5, 128.2, 127.8, 126.6, 125.1, 124.6, 124.5, 124.0, 51.7

TABLE 5

| DPOTP light-emitting spectrum data ||||
|---|---|---|---|
| DPOTP | | Conc. (M) | Wavelength (nm) |
| UV | DCM | $1 \times 10^{-5}$ | 266, 273 |
|  | thinfilm |  | — |
| FL | DCM | $1 \times 10^{-5}$ | 310 |
|  |  | $1 \times 10^{-4}$ | — |
|  |  | $1 \times 10^{-3}$ | — |
|  | thinfilm |  | — |
| 77K | Solution | $1 \times 10^{-5}$ | 394 |
|  | Thinfilm |  | — |

Referring to the below scheme, the synthetic process of the triptycene derivatives with asymmetric di-substituents is herein disclosed.

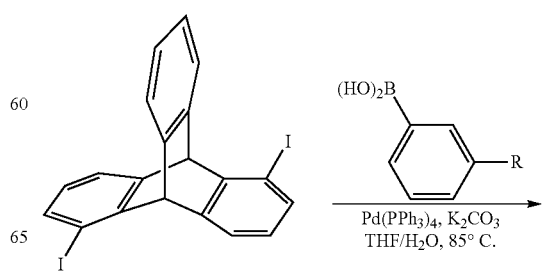

-continued

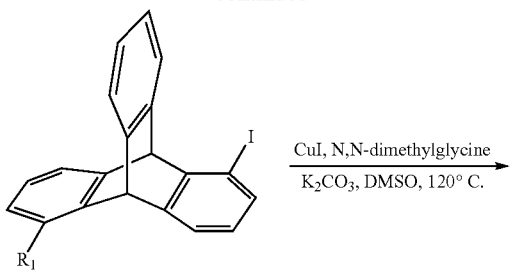

Moniodotriptycene Derivatives 1,5-diiodotriptycene (505 mg, 1.0 mmol), boronic acid (1.5 mmol) and Pd(PPh$_3$)$_4$ (23 mg, 2 mol %) were dissolved in anhydrous THF (50 ml) and then added 2M K$_2$CO$_{3(aq)}$ (15 ml) with nitrogen purge. The mixture was heated to reflux for 12 hours and then extracted with EA (ethyl acetate, 50 ml×3) and purified with column chromatography.

IPyTP(1-iodo-5-pyridinyltriptycene)

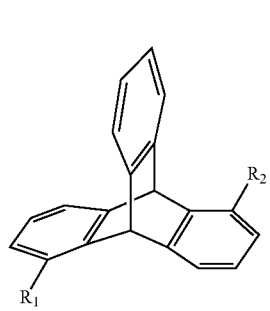

$^1$H NMR (400 MHz, CDCl$_3$, δ):

8.71-8.67 (m, 2H), 7.71 (d, J=7.6 Hz, 1H), 7.51-7.42 (m, 4H), 7.31 (d, J=7.2 Hz, 1H), 7.21 (d, 1=7.2 Hz, 1H), 7.10 (t, J=7.6 Hz, 1H), 7.08-6.97 (m, 3H), 6.68 (t, J=7.6 Hz, 1H), 5.83 (s, 1H), 5.53 (s, 1H).

$^{13}$C NMR (100 MHz, CDCl$_3$, δ):

150.0, 148.5, 148.4, 146.5, 145.1, 144.4, 142.7, 136.5, 135.9, 135.0, 133.9, 127.1, 126.6, 125.6, 125.6, 125.5, 124.2, 124.0, 123.6, 123.4, 58.3, 51.2

BIITP(1-Iodo-5-[3-(1'-phenyl-1H-benzo[d]imidazole)phenyl]triptycene)

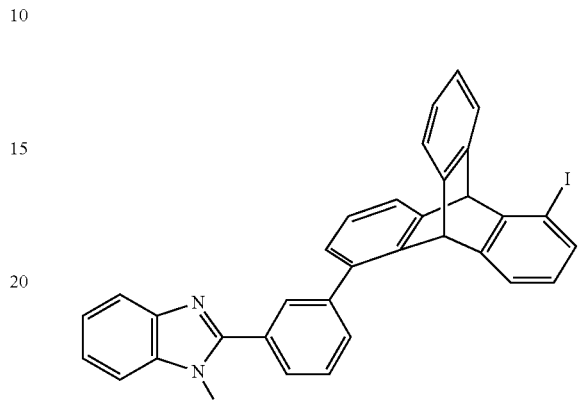

$^1$H NMR (400 MHz, CDCl$_3$, δ):

7.95 (d, J=8.0 Hz, 1H), 7.77 (d, J=5.6 Hz, 1H), 7.66-7.23 (m, 12H), 7.03-6.99 (m, 2H), 6.66 (t, J=6.4 Hz, 1H), 5.78 (s, 1H), 5.60 (s, 1H).

$^{13}$C NMR (100 MHz, CDCl$_3$, δ):

152.2, 148.6, 146.8, 144.8, 144.6, 144.5, 142.4, 140.2, 137.2, 136.9, 136.9, 134.9, 130.5, 130.5, 130.3, 129.9, 129.4, 128.7, 128.6, 128.4, 128.3, 127.5, 127.5, 127.0, 126.4, 125.5, 125.4, 125.1, 124.1, 123.8, 123.4, 123.1, 119.9, 110.5, 94.0, 58.3, 51.1

IDPyTP(1-Iodo-5-[(3,5-dipyridin-3-yl)phenyl]triptycene)

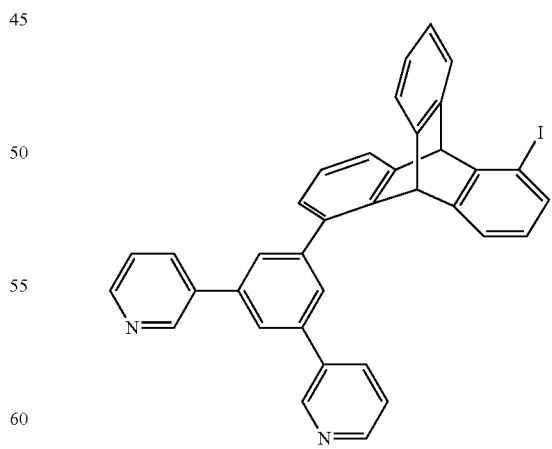

$^1$H NMR (400 MHz, CDCl$_3$, δ):

9.03-9.00 (m, 1H), 8.70-8.68 (m, 2H), 8.08 (d, J=6.8 Hz, 2H), 7.75-7.63 (m, 3H), 7.53-7.42 (m, 6H), 7.16-7.00 (m, 4H), 6.70 (t, J=7.6 Hz, 1H), 5.85 (s, 1H), 5.66 (s, 1H).

$^{13}$C NMR (100 MHz, CDCl$_3$, δ):

148.1, 147.9, 144.5, 136.0, 135.0, 134.8, 134.7, 132.1, 132.0, 131.9, 129.7, 128.5, 128.4, 127.7, 127.1, 126.5, 125.7, 125.6, 125.5, 124.8, 123.8, 58.4, 51.4

Triptycene Derivatives with Asymmetric Di-Substituents

To a mixture of Moniodotriptycene derivative (0.5 mmol), carbazole (0.6 mmol), CuI (10 mol %), N,N-dimethyl glycine (20 mol %), K$_2$CO$_3$ (5.0 mmol), and DMSO (4 ml) in a seal tube with nitrogen purge. The mixture was heated to 120° C. and maintained for 72 hours and then poured to water, extracted with DCM (50 ml×3) and purified with column chromatography.

CPyTP(1-(9H-carbazol-9-yl)-5-pyridin-3-yl-triptycene)

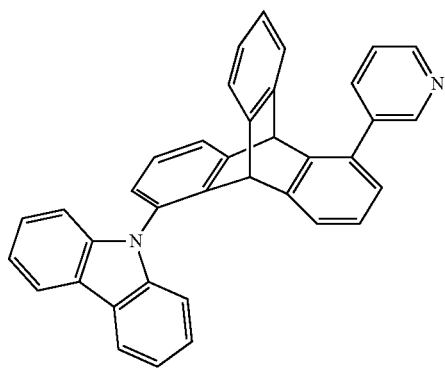

CPyTP
$E_s/E_T$ (eV) = 3.65/3.02
HOMO/LUMO = 5.78 (5.91$^a$)/2.11

BICTP(1-(9H-carbazol-9-yl)-5-[3-(1'-phenyl-1H-benzo[d]imidazole)phenyl]triptycene)

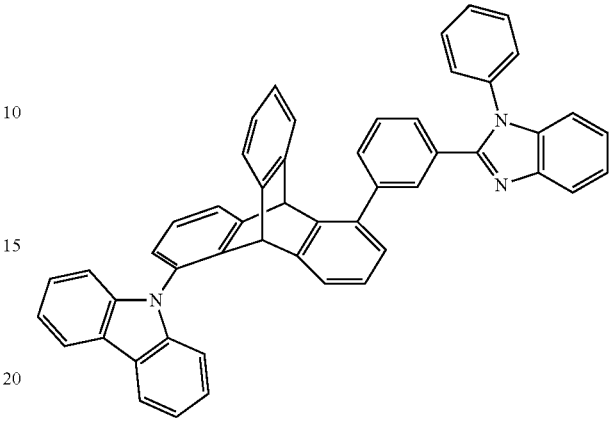

BICTP
$E_s/E_T$ (eV) = 3.74/2.81
HOMO/LUMO = 6.21 (5.78$^a$)/2.47

$^1$H NMR (400 MHz, CDCl$_3$, δ):

8.23 (d, J=7.6 Hz, 1H), 7.95 (d, J=7.6 Hz, 1H), 7.71 (d, J=7.6 Hz, 1H), 7.65 (s, 1H), 7.55-7.26 (m, 16H), 7.18 (t, J=8.8 Hz, 1H), 7.15 (d, J=7.2 Hz, 1H), 7.08-6.99 (m, 8H), 6.95 (t, J=8.8 Hz, 1H), 6.65 (d, J=8.8 Hz, 1H), 5.81 (s, 1H), 5.03 (s, 1H).

$^{13}$C NMR (100 MHz, CDCl$_3$, δ):

145.0, 144.8, 144.4, 142.7, 141.7, 140.3, 137.2, 137.0, 136.8, 130.7, 130.6, 130.4, 129.9, 128.6, 128.4, 127.5, 127.0, 126.4, 126.3, 125.9, 125.4, 125.3, 125.2, 125.2, 124.8, 124.4, 124.0, 123.8, 123.7, 123.6, 123.5, 123.2, 123.1, 120.2, 120.0, 119.8, 110.5, 50.8, 49.6

TABLE 6

CPyTP light-emitting spectrum data

| CPyTP | | Conc. (M) | Wavelength (nm) |
|---|---|---|---|
| UV | DCM | 1 × 10$^{-5}$ | 339, 293 |
| | THF | 1 × 10$^{-5}$ | 338, 292 |
| | ACN | 1 × 10$^{-5}$ | 337, 291 |
| | TOL | 1 × 10$^{-5}$ | 339, 293 |
| | Thin film | | 341, 296 |
| FL | DCM | 1 × 10$^{-5}$ | 347, 363 |
| | THF | 1 × 10$^{-5}$ | 346, 362 |
| | ACN | 1 × 10$^{-5}$ | 346, 361 |
| | TOL | 1 × 10$^{-5}$ | 349, 363 |
| | Thin film | | 429 |
| 77K | Solution | 1 × 10$^{-5}$ | 411, 438, 459 |
| | Thin film | | 438 |

TABLE 7

BICTP light-emitting spectrum data

| BICTP | | Conc. (M) | Wavelength (nm) |
|---|---|---|---|
| UV | DCM | 1 × 10$^{-5}$ | 339, 293 |
| | THF | 1 × 10$^{-5}$ | 337, 292 |
| | ACN | 1 × 10$^{-5}$ | 335, 290 |
| | TOL | 1 × 10$^{-5}$ | 340, 294 |
| | Thin film | | 342, 296 |
| FL | DCM | 1 × 10$^{-5}$ | 346, 363 |
| | THF | 1 × 10$^{-5}$ | 346, 362 |
| | ACN | 1 × 10$^{-5}$ | 346, 363 |
| | TOL | 1 × 10$^{-5}$ | 346, 361 |
| | Thin film | | 350, 363, 429, 494 |
| 77K | Solution | 1 × 10$^{-5}$ | 453, 487, 509 |
| | Thin film | | 482, 524 |

CDPyTP(1-(9H-carbazol-9-yl)-5-[(3,5-dipyridin-3-yl)phenyl]triptycene)

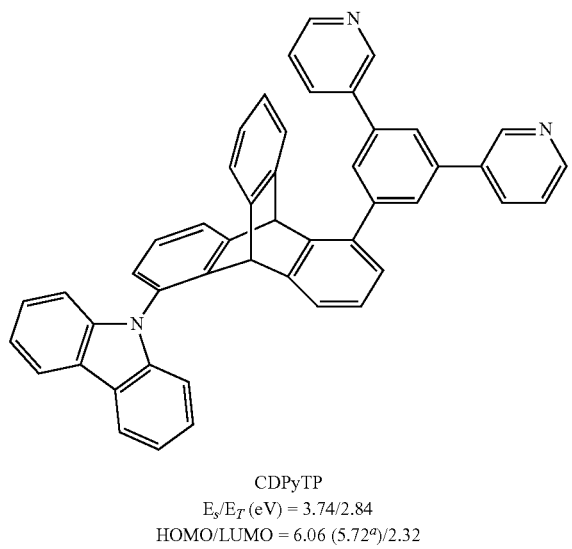 [SMILES: c1cncc(-c2cc(-c3cccnc3)cc(-c3cccc4c3C3c5ccccc5C4c4c3cccc4-n3c4ccccc4c4ccccc43)c2)c1]

CDPyTP
$E_S/E_T$ (eV) = 3.74/2.84
HOMO/LUMO = 6.06 (5.72$^a$)/2.32

$^1$H NMR (400 MHz, CDCl$_3$, δ):
9.07-9.04 (m, 2H), 8.69-8.65 (m, 3H), 8.24 (d, J=4.4 Hz, 2H), 8.06-7.86 (m, 5H), 7.73 (s, 2H), 7.69-7.26 (m, 8H), 7.17-6.95 (m, 10H), 5.84 (s, 1H), 5.09 (s, 1H).
$^{13}$C NMR (100 MHz, CDCl$_3$, δ):
148.9, 148.8, 148.2, 147.5, 144.9, 144.9, 144.4, 143.9, 142.8, 142.3, 141.7, 139.0, 136.7, 136.1, 134.8, 134.7, 132.5, 128.6, 127.9, 126.7, 126.6, 126.4, 126.0, 125.9, 125.5, 125.5, 125.4, 124.8, 124.6, 124.2, 123.9, 123.7, 123.5, 123.3, 123.2, 120.3, 120.3, 119.9, 119.8, 110.4, 110.2, 51.1, 49.6.

TABLE 8

| CDPyTP light-emitting spectrum data | | |
|---|---|---|
| CDPyTP | Conc. (M) | Wavelength (nm) |
| UV | DCM 1 × 10$^{-5}$ | 339, 292 |
| | THF 1 × 10$^{-5}$ | 323, 291 |
| | ACN 1 × 10$^{-5}$ | 339, 325, 290 |
| | TOL 1 × 10$^{-5}$ | 341, 326, 293 |
| | Thin film | 341, 326, 293 |
| FL | DCM 1 × 10$^{-5}$ | 349, 362, 445 |
| | THF 1 × 10$^{-5}$ | 346, 361, 437 |
| | ACN 1 × 10$^{-5}$ | 346, 359, 445 |
| | TOL 1 × 10$^{-5}$ | 346, 363, 437 |
| | Thin film | 444 |
| 77K | Solution 1 × 10$^{-5}$ | 437, 463, 489 |
| | Thin film | — |

Refer to FIG. 1, which is a schematic diagram illustrating a light emitting device containing triptycene derivatives according to one embodiment of the present invention. The light emitting device includes an emitting layer 3 configured between the anode 1 and cathode 2. The emitting layer 3 is made of host emitting material doped with light emitting material. The light emitting device may also include a hole transport layer 4, an electron blocking layer 9, an emitting layer 3, an electron block layer 6, an electron transport layer 5 and an electron injecting layer 8. The real thickness of each layer doesn't correspond to the schematic size, and electron blocking layer 9, electron block layer 6 and electron inject-ing layer 8 may be optional. It is noted that the triptycene derivatives may be a host emitting material in the emitting layer; the triptycene derivatives may be an electron transport material or a hole transport material.

For example, the organic light emitting diode of the present invention may be a blue phosphorescent light emitting diode, a green phosphorescent light emitting diode or a red phosphorescent light emitting diode.

In the tested electroluminescent devices, the substrate is made of ITO; tested electrode materials include LiF/Al; tested emitting materials include FirPic; the test electron transport materials include TAZ (3-phenyl-4-(1'-naphthyl)-5-phenyl-1,2,4-triazole), BCP (2,9-dimethyl-4,7-diphenyl-[1,10]phenanthroline) and Alq$_3$ (tris(8-hydroxyquinoline) aluminum(III) which can be used for the hole blocking layer or simultaneous hole stopper layer and electron transport layer. The test hole transporting materials include NPB (4,4'-bis[N-(1-naphthyl)-N-phenyl-amino]bipheny), and mCP (1,3-Bis(N-carbazolyl)benzene), which can be used for the hole blocking layer or simultaneous electron blocking layer and hole transport layer.

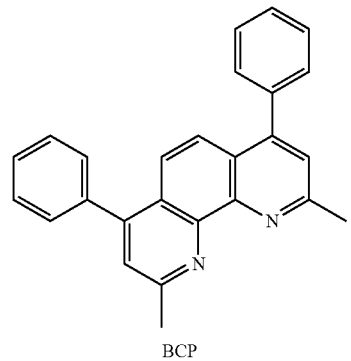

BCP

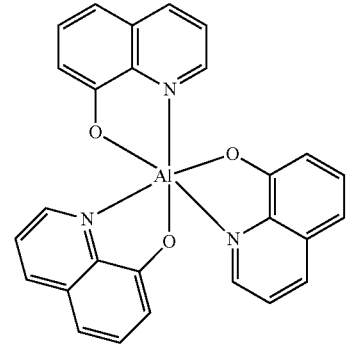

Alq$_3$

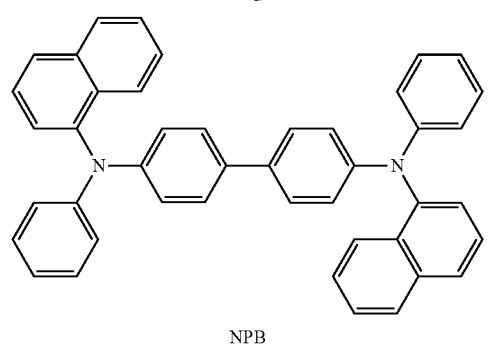

NPB

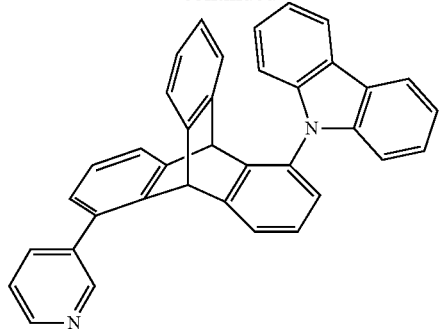

CzPyTP

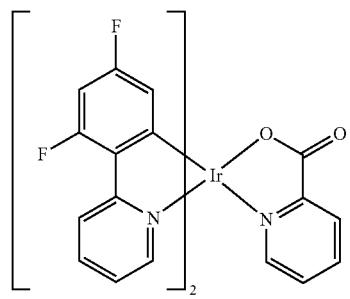

FIrpic

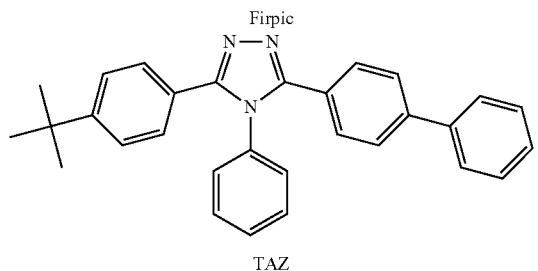

TAZ

The detailed structures of the tested devices are as follows:
A: NPB(30)/mCP(20)/CzPyTP:8% FIr(pic)(25)/TAZ(50)
B: NPB(30)/mCP(20)/CzPyTP:8% FIr(pic)(25)/TAZ(30)
C: NPB(30)/mCP(20)/CzPyTP:8% FIr(pic)(25)/BCP(40)
D: NPB(30)/mCP(20)/CzPyTP:8% FIr(pic)(25)/BCP(10)/Alq$_3$(40)

TABLE 9

Performance of blue OLED

| | $V_{on}$, (V) | L, (Cd/m$^2$, V) | $\eta_{ext}$, (%, V) | $\eta_c$, (Cd/A, V) | $\eta_p$, (lm/W, V) | CIE, @8 V (x, y) |
|---|---|---|---|---|---|---|
| A | 4.69 | 4418, 16.0 | 5.4, 6.0 | 10.8, 6.0 | 5.8, 5.5 | (0.20, 0.36) |
| B | 4.74 | 3284, 15.0 | 2.7, 7.5 | 6.4, 7.5 | 2.7, 7.5 | (0.17, 0.37) |
| C | 5.64 | 4207, 17.5 | 2.9, 8.5 | 7.2, 8.5 | 2.6, 8.5 | (0.19, 0.38) |
| D | 4.75 | 6300, 17.5 | 5.1, 5.0 | 13.6, 5.0 | 8.5, 5.0 | (0.23, 0.42) |

To sum up, the triptycene derivatives of the present invention may be provided with symmetric or asymmetric di-substituents. The triptycene derivatives of the present invention may be applied in deep blue or red light-emitting device and used as host material, electron transport material or hole transport material.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A triptycene derivative having a chemical formula represented by Formula (I):

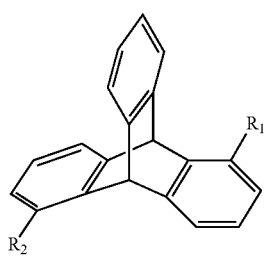

(I)

wherein each of $R_1$ and $R_2$ is independently selected from the group consisting of the following:

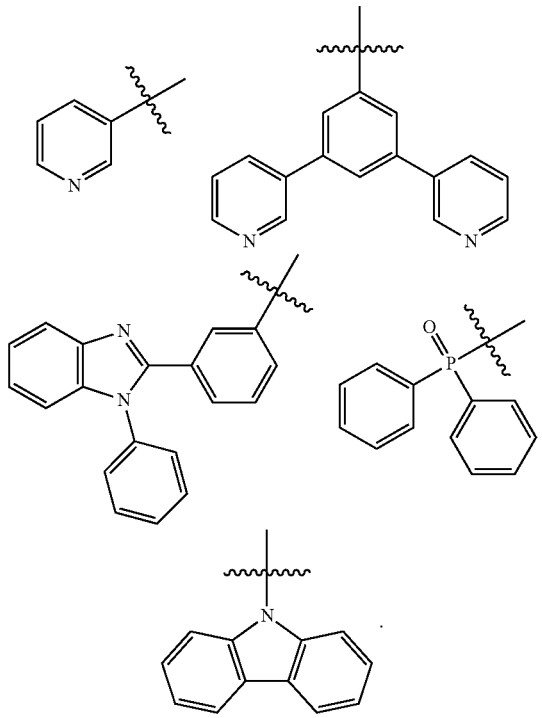

2. The triptycene derivative as claimed in claim 1, wherein $R_1$ and $R_2$ are the same.

3. The triptycene derivative as claimed in claim 1, wherein $R_1$ and $R_2$ are different.

4. An organic light emitting diode, comprising:
a cathode;
an anode; and
an organic layer configured between the cathode and the anode and comprising a triptycene derivative having a chemical formula represented by Formula (I):

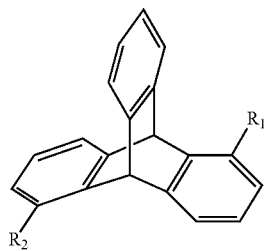

(I)

wherein each of $R_1$ and $R_2$ is independently selected from the group consisting of the following:

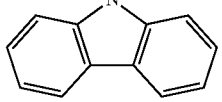

-continued

5. The organic light emitting diode as claimed in claim 4, wherein $R_1$ and $R_2$ are the same.

6. The organic light emitting diode as claimed in claim 4, wherein $R_1$ and $R_2$ are different.

7. The organic light emitting diode as claimed in claim 4, wherein the organic light emitting diode is a blue phosphorescent light emitting diode, a green phosphorescent light emitting diode, or a red phosphorescent light emitting diode.

8. The organic light emitting diode as claimed in claim 4, wherein the organic layer is a light-emitting layer, and the triptycene derivative is a host emitting material.

9. The organic light emitting diode as claimed in claim 4, further comprising:

an emitting layer configured between the cathode and the anode, wherein the organic layer is an electron transport layer configured between the emitting layer and the cathode, and the triptycene derivative is an electron transport material.

10. The organic light emitting diode as claimed in claim 4, further comprising:

an emitting layer configured between the cathode and the anode, wherein the organic layer is a hole transport layer configured between the emitting layer and the anode, and the triptycene derivative is a hole transport material.

* * * * *